(12) United States Patent
Wu et al.

(10) Patent No.: US 6,243,506 B1
(45) Date of Patent: Jun. 5, 2001

(54) OPTICAL FREQUENCY AND TEMPERATURE SENSOR SYSTEM

(75) Inventors: Jing-shown Wu, Taipei; Shyh-Lin Tsao, Shin-Diann; Chui-Fwu Tsai, Gau-Shyong, all of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 08/896,980

(22) Filed: Jul. 18, 1997

(51) Int. Cl.$^7$ ................................ G02B 6/00; H01S 3/13
(52) U.S. Cl. ............................... 385/12; 372/32; 372/94; 356/350
(58) Field of Search ................... 385/12–13; 372/20, 372/32, 28, 33, 34, 38; 356/345, 352, 350

(56) References Cited

U.S. PATENT DOCUMENTS

| | | | |
|---|---|---|---|
| 4,368,981 | * 1/1983 | Ozeki | 356/352 |
| 4,632,551 | * 12/1986 | Pavlath | 356/345 |
| 4,896,327 | * 1/1990 | Ebberg | 372/32 |

* cited by examiner

*Primary Examiner*—Hemang Sanghavi
(74) *Attorney, Agent, or Firm*—Jacobson, Price, Holman & Stern, PLLC

(57) ABSTRACT

This invention proposed a temperature and optical frequency sensor using two different optical resonators. The fiber with different thermal expansion factor and refractive index can be used to sense the temperature variation. The optical resonators with different cavity lengths can be used to detect the frequency deviation. Applying a laser, a microprocessor and two optical resonators with different thermal expansion factors and resonate lengths, we invent the device which can detect the temperature and frequency simultaneously. Furthermore, the device can provide tunable and highly stabilized light source for optical system application.

15 Claims, 6 Drawing Sheets

Corning Fiber (THz)

UK Fiber (THz)

Differential Signal of Rings at 30.06 C (THz)

OPTICAL FREQUENCY AND TEMPERATURE SENSOR SYSTEM

FIELD OF THE INVENTION

The invention relates to an optical frequency and temperature sensor and its applications. Especially, this invention uses more than one set of optical resonators with fibers having different thermal expansion factors and refractive indices which can be used to detect the temperature and optical frequency simultaneously in order to be used for designing a highly stabilized frequency for light source of laser system.

CROSS-REFERENCE TO RELATED APPLICATION

The optical fiber sensor has been wildely used for temperature detection and frequency stabilization for the following reasons: light weight, high temperature sensitivity and compatible to all fiber systems. Especially frequency division multiplexing communication systems require higher channel density. Maintaining a tunable frequency and stabilized light source is very important.

In the area of research & development on frequency stabilization for laser system, articles issued by S. Sudo et al in 1989 in IEEE PHOTONICS TECHNOLOGY LETTERS, Vol. I, 10th Issue, PP281–284 and by M. Tetu et al in the same year in JOURNAL OF LIGHTWAVE TECHNOLOGY, Vol. 7, 10th Issue, PP 1540–1547, proposed that the feed-back control can be carried out with molecule to absorb the spectrum or with atom resonance frequency spectrum to serve as reference for an absolute stabilized frequency. However, both atom and molecule are difficult to purify and pack, the frequency band has lower tunability and installations for such a usage could be very expensive. Therefore, these proposals are not wildely applied to communication systems. Until in 1994, E. T. Peng et al suggested in their article in IEEE PHOTONICS TECHNOLOGY LATTERS to use a delicate thermostat in the present single optical fiber resonator frequency control device to control the temperature to 0.01° C., or as suggested by U.S. Pat. No. 4,896,327 issue to A. Ebberg in 1990 to use a temperature complementary device to stabilize the temperature for optical fiber resonator. Obviously, all these proposals are limited to have the detection to be made on frequency of light source only when a highly stabilized temperature is able to be maintained. Since the frequency and temperature are interrelated to each other and any change happened to one which would cause a variation to the other. Therefore, these methods of keeping a stabilized temperature is not very reliable which will lead the system to be less delicate and having lower sensibility.

BRIEF SUMMARY OF THE INVENTION

In view of the above, the invention proposed a temperature and optical frequency sensor using two different optical fiber resonators. The fiber with different thermal expansion factor and refractive index can be used to sense the temperature variation. The optical resonators with different cavity lengths can be used to detect the frequency deviation. Applying a laser, a micro-processor and two optical resonators with different thermal expansion factors and resonate lengths, the device which can detect the temperature and frequency simultaneously. Furthermore, this device can provide tunable and highly stabilized light source for optical system application.

Instead of using a delicate thermostat to control the temperature to 0.01° C., or using temperature complementary device to stabilize temperature, this invention applied in its sensor system with more than one set of different optical fiber resonators. Data obtained from this arrangement is to serve for the detection of frequency of light source and of temperature according to digital data mapping in microprocessor system. This system shall be able to detect frequency and temperature simultaneously and to provide a tunable and stabilized light source for optical fiber communication system through a feed-back mechanism.

One important object of this invention is to provide a sensor system with a feed-back mechanism for stabilizing the optical frequency without highly accurate temperature control.

Moreover, another object of this invention is to provide a sensor system which has a high sensitivity for temperature sensing without frequency stabilization.

One advantage of this invention is to provide a sensor system which does not have to raise its SNR of characteristic curve of fiber ring resonator by modulation, instead, using the method of subtraction between respective characteristic curves of the fiber resonators to obtain higher SNR for a part of its frequency band.

DETAILED DESCRIPTION

Brief Description of the Drawings

FIG. 4(b) UK fiber

a . . . 227.244 THz b . . . 227.2433 THz c . . . 227.248 THz

Figure 1:
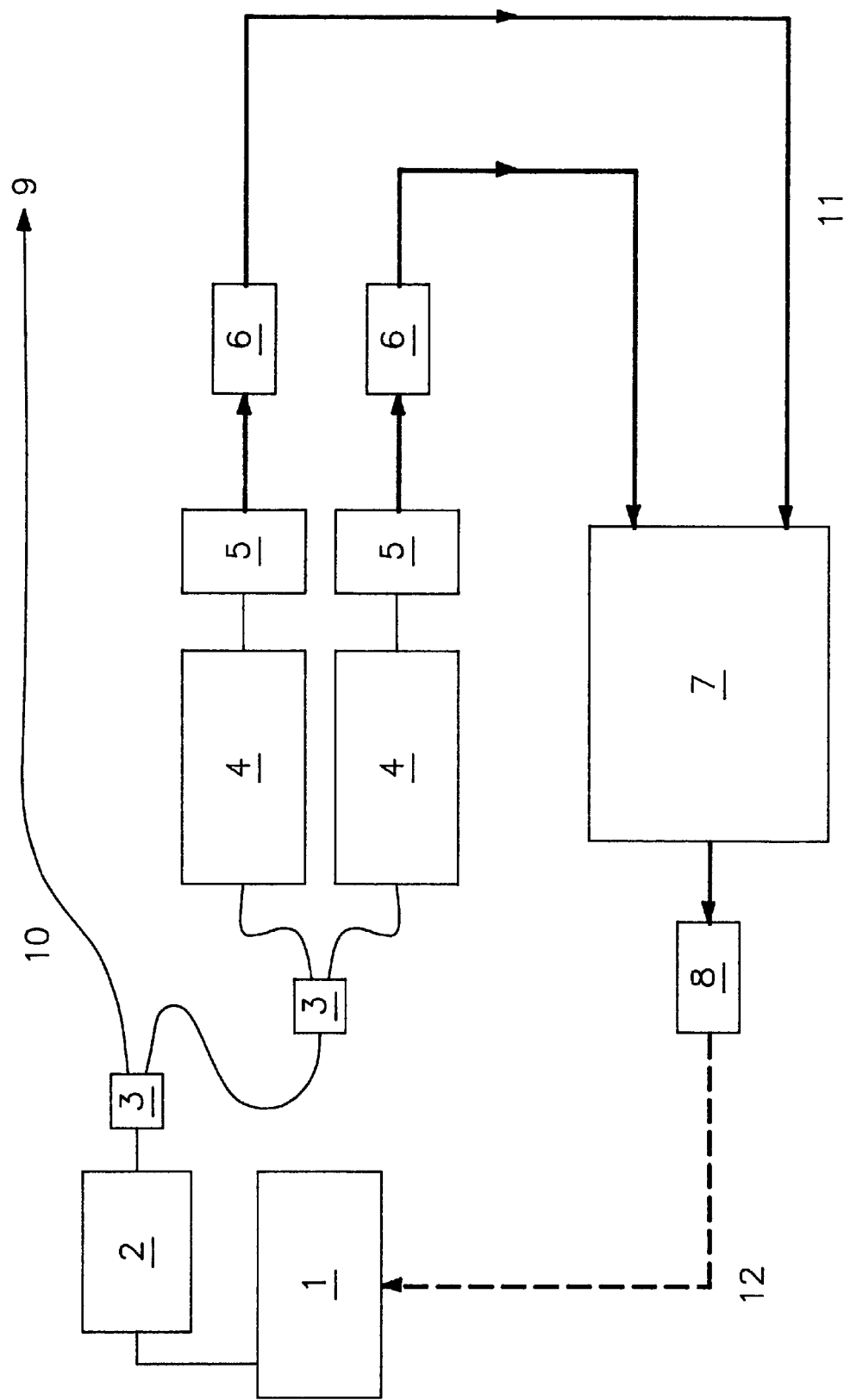
FIG. 1 is a diagram showing the structure of a sensor system according to the invention.
Figure 2:
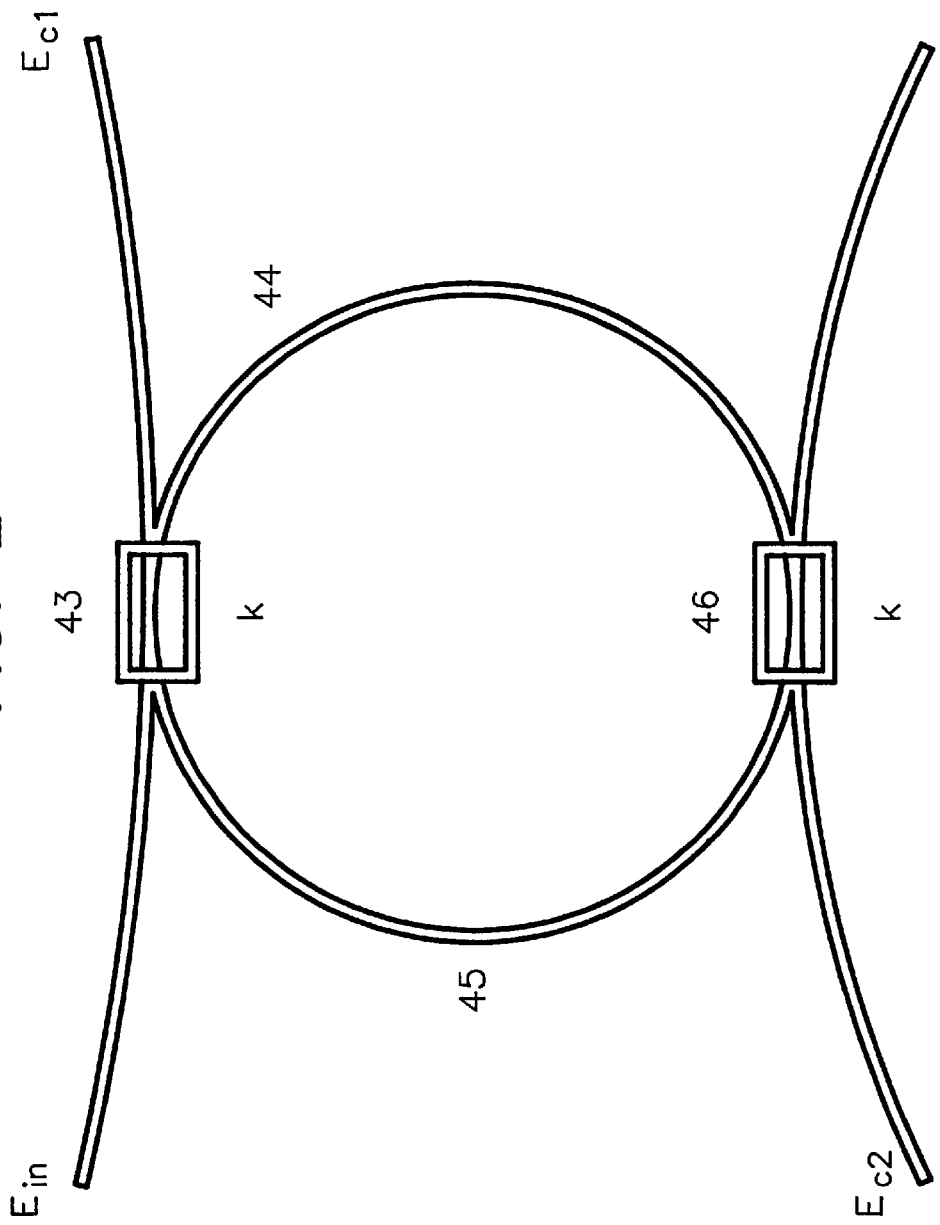
FIG. 2 is a schematic drawing showing the shape of a fiber ring resonator.
Figure 3:
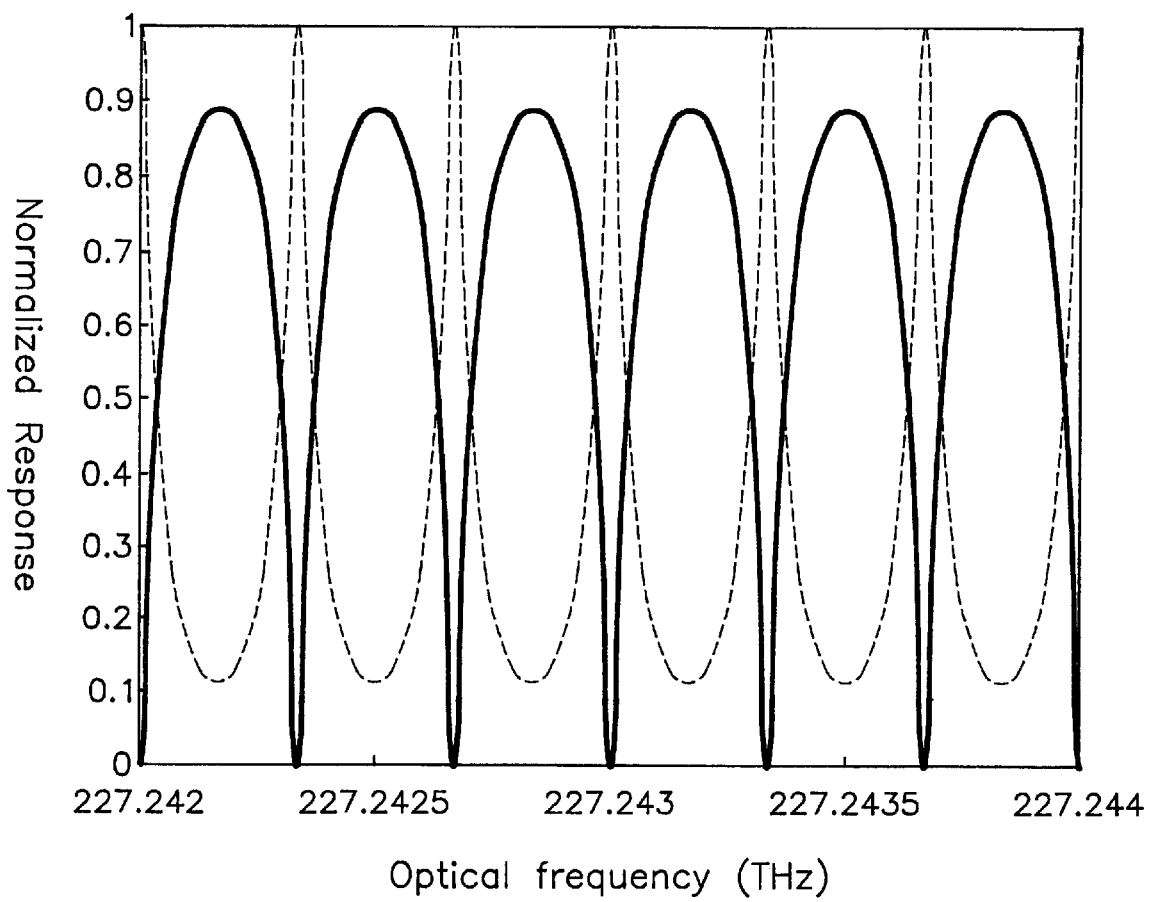
FIG. 3 is a graph showing the penetrating and notch frequency response of a fiber ring resonator, straight line . . . is the power frequency response of notch output terminal as $|E_{C1}/E_{in}|^2$ dotted line . . . is the power frequency response of penetrating output terminal as $|E_{C2}/E_{in}|^2$

REFERENCE NUMBER OF THE ATTACHED DRAWINGS 1. optical source,
2. Polarization Controller,
3. Optical Coupler,
4. fiber ring resonator
5. optical Detector,
6. A/D Converter
7. Microprocessor,
8. D/A Converter,
9. Tunable frequency stabilized optical light
10. fiber
11. cable 12. feedback signal
43, 46. optical coupler
44, 45. optical fiber ring Refer to FIG. 1 for a logic structure of a sensor system according to the invention. This system composed of an optical source(1), Polarization Controller(2), Optical Coupler(3), Fiber Ring Resonator(4), Optical Detector(5), A/D Converter(6), Microprocessor(7), D/A Converter(8), Tunable Frequency Stabilized Optical Light(9). The characteristics in the fiber ring resonators(4) including optical fiber couplers and linking fibers are modeled by mathematical equations derived from electromagnetic theory. This invention is based on the mathematical model. The detailed theory of this invention shall be explained with reference to FIG. 1–6 as follows:

The outputs of a fiber ring resonator shown in FIG. 2 can be expressed as following equation:

$$E_{C1} = \frac{\sqrt{(1-k)(1-r)}\{1-(1-r)e^{j2m}\}}{1-(1-k)(1-r)e^{j2m}} E_{in} \quad (1)$$

$$E_{C2} = \frac{-k(1-r)e^{jlm}}{1-(1-k)(1-r)e^{j2m}} E_{in} \quad (2)$$

where $E_{in}$ is the electric field of input light wave, $E_{C1}$ is the electric field of light wave of notch output, $E_{C2}$ is the electric field of light wave of penetrating output, $$\beta = 2\pi/\lambda = \frac{2\pi n f}{c}$$

is the propagation constant,

κ is a constant for light split ratio of optical coupler, r is intrinsic coupling loss of optical coupler, l is the whole length of optical fiber ring. Where, we assume that the K and r are the same and $L_1=L_2$, λ is the transmissive wavelength of lights in the optical fiber, f is light source optical frequency, n is coefficient of refraction index of optical fiber, c is velocity of light in vacuum, j is a symbol of imaginary number $\sqrt{-1}$, Therefore, $|E_{C1}/E_{in}|^2$ is the power frequency response of notch output terminal and $|E_{C2}/E_{in}|^2$ is the power frequency response of penetrating output terminal. FIG. 3 is an example to show these frequency responses.

Two fiber ring resonators with different temperature coefficients are employed in this invention. The polarization controller used in this invention can control the polarization of input light wave in order to achieve a maximum output for fiber ring resonators. If the length of fiber in the fiber ring resonator is long, then, "polarization maintaining fiber" can be used to manufacture this fiber ring resonator in order to avoid any error due to polarization fluctuation. Hence, signal mode fiber can also be used when ring length is not long.

Figure 4A:
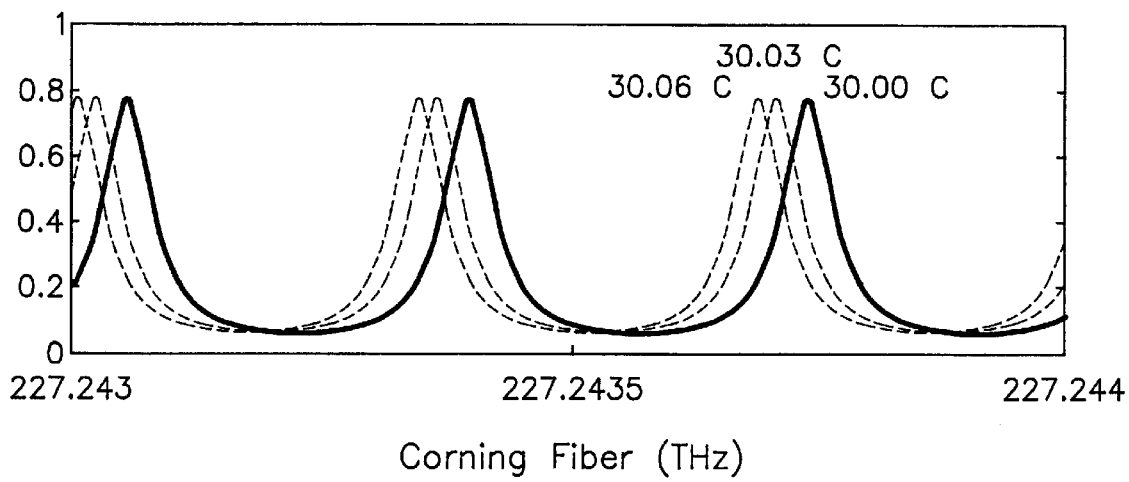
FIG. 4(a)–4(b) is similar to the FIG. 3 but showing the response under different temperature, FIG. 4(a) corning fiber
Figure 4B:
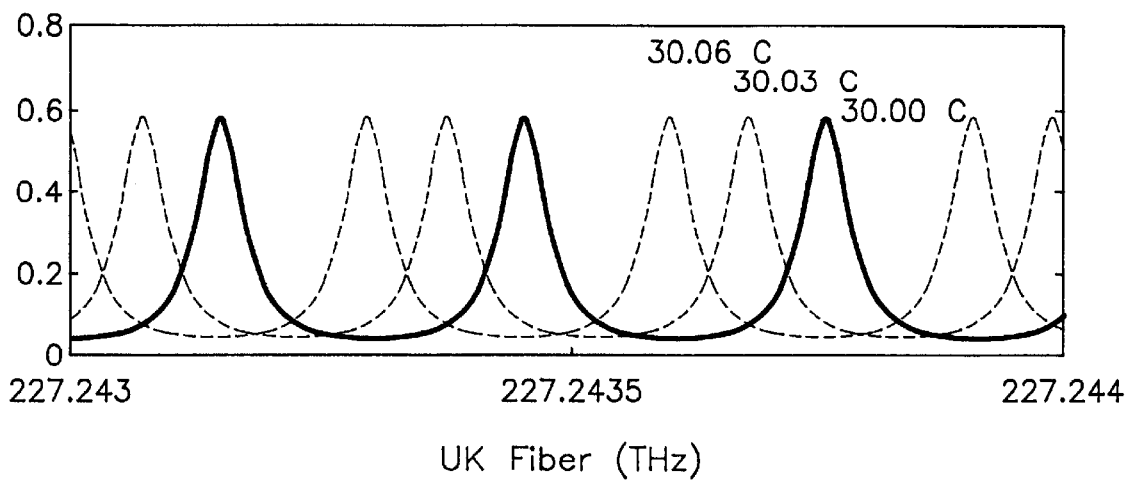
Figure 5:
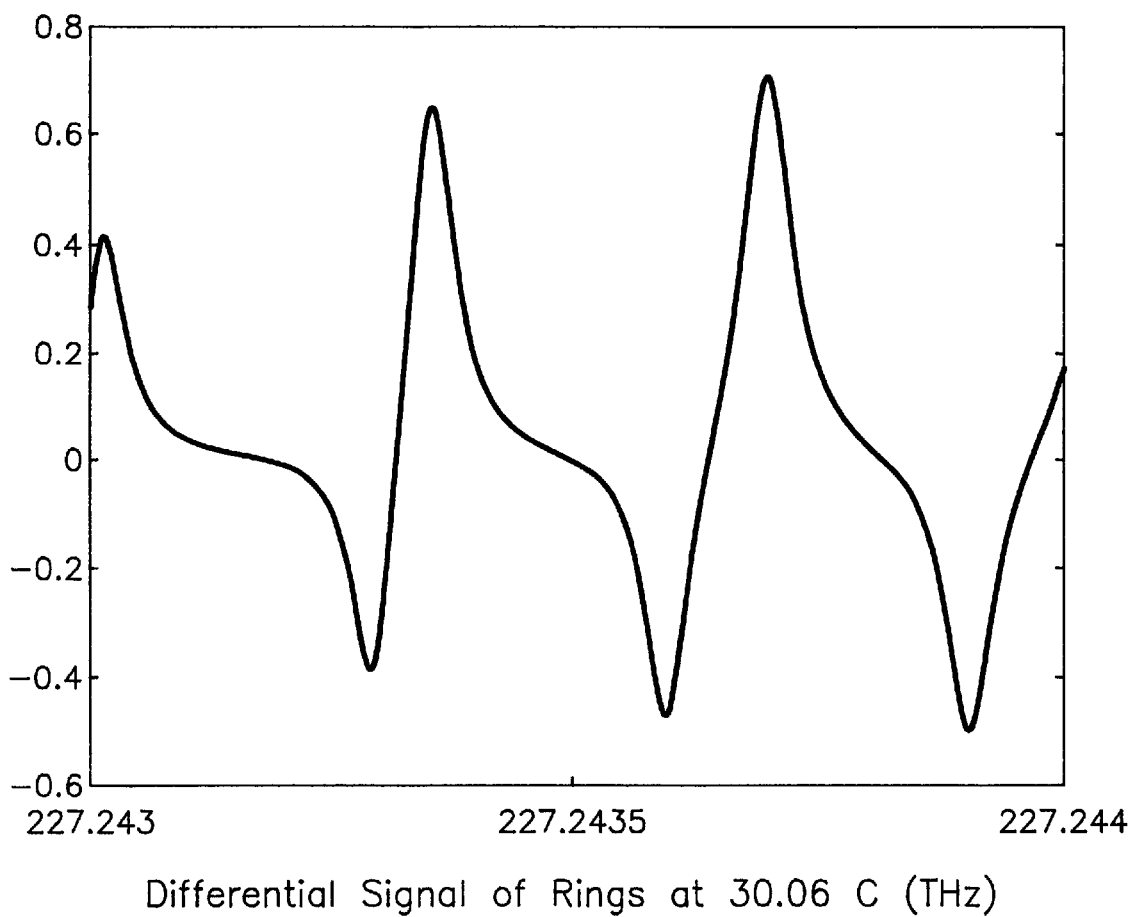
FIG. 5 is a graph showing the differential effect between double ring fiber resonators while the temperature is 30.06° C.

Taking different temperature expansion factors and refractive indices of different kinds of optical fiber into consideration for designing, the resonators of this invention include two optical couplers allowed to use two different kinds of fibers. Here, it should be noted that the major parts for the structure of optical fiber are: core; cladding and jacket. If any one of these three parts is different then the whole fiber is different. Thus, any impurity in fiber or different painting jacket material are all within the scope of this invention. When temperature variation take place, the differences of temperature will induce the fiber ring resonators change fiber lengths and refractive indices, resulting in shifting their frequency responses. FIG. 4 shows the different penetrating frequency responses ($|E_{C2}/E_{in}|^2$) under different temperatures. FIG. 4(a) and FIG. 4(b) are experimental results; the parameters of fiber rings used are shown in Table I.

Different optical fibers made of different materials and different cavity lengths for optical fiber resonator can be designed to achieve different thermal responses of fiber ring resonators. Differences in the optical fiber core, cladding, or jacket such as employing different material, or coating metal or plastic polymers on fiber will result in different frequency responses.

From FIG. 4, we know the relationship between received power $P_1$, $P_2$ and f, T can be expressed by the following equations:

$$P_{R1} = f_{R1}(f, T) \quad (3)$$

$$P_{R2} = f_{R2}(f, T) \quad (4)$$

where, Px is the penetrating output responses of fiber ring resonators labeled x, fx is the frequency response functions labeled x, x=$R_1$ or $R_2$, f is the optical frequency and T is the temperature.

Inverse transfer the function of Eq. (3) and (4), we can resolve the frequency and temperature as:

$$f = g_a(P_{R1}, P_{R2}) \quad (5)$$

$$T = g_b(P_{R1}, P_{R2}) \quad (6)$$

In equation(5) and equation(6), the $P_{R1}$, $P_{R2}$ are detected signals and functions $g_a()$, $g_b()$ can be derived from equation (3) and (4). First, database $g_a()$, $g_b()$ should be established for speedy process for digital feedback through microprocessor and undertake a comparison to obtain the corresponding temperature and frequency at the same time.

Using just one optical fiber ring resonator in a system, one can not resolve the frequency and temperature simultaneously. To address this situation, the above invention uses double optical fiber ring resonators, to enhance the sensibility and resolve the frequency & temperature simultaneously. The above mentioned invention using two fiber ring resonators has a differential effect on frequency response of optical fiber ring resonators, as shown in FIG. (5). The differential effect is shown in passing band. With this differential effect, the range of low sensible area can be reduced. Therefore, using two optical fiber resonators according to this invention technique can increase the sensibility for detection.

This invention can be used to stabilize the frequency of light source without temperature control.

Figure 6:
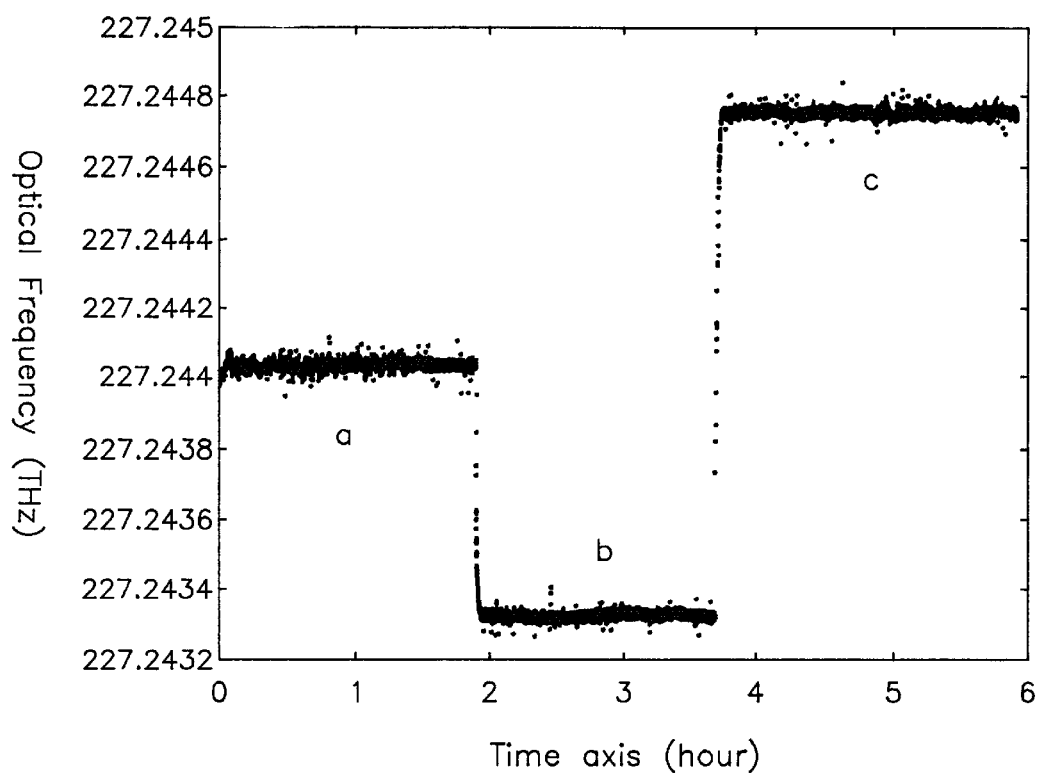
FIG. 6 is a graph showing the stabilizing frequency effect during temperature variation.

A tunable frequency stabilization experiment using different products of optical fiber such as Corning fiber and UK fiber is shown in FIG. 6. The parameters of these two fiber rings are shown in Table I, where the thermal factor η is defined as following $$\eta = d(nl)/(dT) = n(dl/dT) + l(dn)/(dT) \text{ and}$$

-continued $$\zeta = \frac{dn}{dT}\rho = \frac{dl}{ldT}$$

Here, the thermo-optic coefficients $\zeta$ and thermal expansion coefficients $\rho$ used in this experiment are:

$\zeta_{CO} \cong 6.0287 \times 10^{-6}$, $\zeta_{nk} \cong 6.0877 \times 10^{-6}$ $\rho_{CO} \cong 4.0191 \times 10^{-6}$, $\rho_{nk} \cong 4.0578 \times 10^{-6}$ Because using a single fiber ring resonator can not resolve optical frequency and temperature simultaneously, and the sensitivity is limited, two fiber ring resonators are adopted in this invention. The similar differential signal from the two fiber ring resonators can increase the sensitivity of resolving temperature and frequency.

In conclusion, the features and characteristics of this invention are:

1. Use similar differential effect between two sets of frequency response signals to increase system sensibility.
2. Digital feedback control.
3. Provide a simple and highly accurate temperature and frequency detection system.
4. The detection of frequency and temperature can be carried out simultaneously.
5. This invention can be applied to tunable laser frequency control under controlled temperature.
6. This invention can be applied to tunable laser frequency control without temperature control.

Having shown and described a preferred embodiment of the present invention by way of example, it should be realized that structural changes could be made and other examples given without departing from either the spirit or scope of this invention.

TABLE 1

|  | Optical fiber resonator from cornings | Optical fiber resonator from UK |
| --- | --- | --- |
| length(l) | 0.2935 | 0.3261 |
| refractive coefficient(n) | 1.4675 | 1.5 |
| coupling coefficient(K) | 0.383 | 0.38 |
| coupling loss(r) | 0.0578 | 0.1315 |
| Temperature coefficient($\eta$) | 3510 nm/° C. | 3960 nm/° C. |

The claims defining the invention are as follows:

1. An optical frequency and temperature sensor system comprising a narrow linewidth optical source, a polarization controller connected to the optical source, an optical coupler connected to the polarization controller, at least two fiber ring resonators connected to the optical coupler, an optical detector connected to each of the fiber ring resonators, an A/D converter connected to the optical detector, a microprocessor connected to the A/D converter, and a D/A converter, wherein the optical source provides a stabilized optical light, each of said fiber ring resonators having different thermal expansion factors and different thermo-optic coefficients for simultaneously detecting surrounding temperature and optical frequency of said light source in a same time.

2. The optical frequency and temperature sensor system of claim 1, the microprocessor comprising an arithmetic circuit to determine the detected optical source frequency and temperature in the same time.

3. The optical frequency and temperature sensor system of claim 1, the microprocessor comprising analog electronic computer circuits to determine the detected frequency and temperature.

4. The optical frequency and temperature system of claim 1, wherein the linewidth of the optical source is narrower than the pass bands of the fiber ring resonators.

5. The optical frequency and temperature sensor system of claim 1, wherein the fiber ring resonators include cladding coated with a thermal-expansion material.

6. The optical frequency and temperature sensor system of claim 1, wherein at least one of the fiber ring resonators has a core, cladding or jacket which is different in thermo-optic characteristics than a respective core, cladding or jacket of the other fiber ring resonator(s).

7. The optical frequency and temperature sensor system of claim 1, wherein at least one of the fiber ring resonators has two parts of a fiber structure, such as a core, cladding or jacket different in thermo-optic characteristics than a respective core, cladding or jacket of the other fiber ring resonator(s).

8. The optical frequency and temperature sensor system of claim 1, wherein each of the fiber ring resonators have a core, cladding and jacket different in thermo-optic characteristics than a respective core, cladding and jacket of the other fiber ring resonator(s).

9. The optical frequency and temperature sensor system of claim 1, wherein at least one of the fiber ring resonators has a thermal expansion coefficient different than a thermal expansion coefficient of the other fiber ring resonator(s).

10. The optical frequency and temperature sensor system of claim 1, wherein at least one of the fiber ring resonators has a cavity length different than a cavity length of the other fiber ring resonator(s).

11. The optical frequency and temperature sensor system of claim 1, wherein the polarization controller controls a polarized direction of an input light wave.

12. The optical frequency and temperature sensor system of claim 1, wherein the frequency and temperature are simultaneously detected even under a non-linear conversion algorithm.

13. A method for simultaneously detecting light frequency and surrounding temperature using the optical frequency and temperature sensor system of claim 1, and which can be applied for light source frequency stabilization.

14. The method claimed in claim 1, wherein temperature monitoring and sensing can be achieved without light source frequency stabilization.

15. An optical frequency and temperature sensor system for stabilizing a light source frequency without temperature control, comprising:

a narrow line width optical source;

a polarization controller connected to the optical source for controlling a polarization of an input light wave to achieve a maximum output;

an optical coupler connected to the polarization controller for receiving the maximum output;

first and second fiber ring resonators connected to the optical coupler, said first fiber ring resonator having a different thermal expansion coefficient, a different thermo-optic coefficient and a different cavity length than a respective thermal expansion coefficient, a respective thermo-optic coefficient and a respective cavity length of said second fiber ring resonator, said first and second fiber ring resonators for simultaneously detecting surrounding temperature and optical frequency of said light source, temperature differences inducing said fiber ring resonators to change fiber lengths and refractive indices, thereby shifting their frequency responses;

an optical detector connected to each of said first and second fiber ring resonators for receiving output from said first and second fiber ring resonators; and a microprocessor for receiving input from said optical detector, said microprocessor having electronic computer circuits to determine the detected frequency and temperature using the frequency responses of said first and second fiber ring resonators.

* * * * *